(12) United States Patent
Watanabe et al.

(10) Patent No.: US 7,215,576 B2
(45) Date of Patent: May 8, 2007

(54) NONVOLATILE SEMICONDUCTOR MEMORY DEVICE WHICH ERASES DATA IN UNITS OF ONE BLOCK INCLUDING A NUMBER OF MEMORY CELLS, AND DATA ERASING METHOD OF THE NONVOLATILE SEMICONDUCTOR MEMORY DEVICE

(75) Inventors: Hiroshi Watanabe, Yokohama (JP); Hideo Kato, Kawasaki (JP); Takamichi Kasai, Yokohama (JP); Kiyomi Naruke, Sagamihara (JP); Hiroyuki Sasaki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 11/213,889

(22) Filed: Aug. 30, 2005

(65) Prior Publication Data

US 2006/0067132 A1    Mar. 30, 2006

(30) Foreign Application Priority Data

Sep. 30, 2004    (JP)    ............... 2004-287700

(51) Int. Cl.
G11C 11/34    (2006.01)
G11C 16/06    (2006.01)
G11C 16/04    (2006.01)

(52) U.S. Cl. ............... 365/185.22; 365/185.18; 365/185.24; 365/185.29

(58) Field of Classification Search ........... 365/185.22, 365/185.29, 185.3, 185.24, 185.18
See application file for complete search history.

(56) References Cited

U.S. PATENT DOCUMENTS 6,452,837 B2    9/2002    Mori et al.
6,496,417 B1 *  12/2002   Shiau et al. ............. 365/185.2
6,532,175 B1 *  3/2003    Yachareni et al. ...... 365/185.22
6,834,012 B1 *  12/2004   He et al. ................ 365/185.18
6,967,873 B2 *  11/2005   Hamilton et al. ........ 365/185.3
7,046,559 B2 *  5/2006    Saito ...................... 365/185.33
7,079,424 B1 *  7/2006    Lee et al. ............... 365/185.29

FOREIGN PATENT DOCUMENTS

JP    8-255489    10/1996
JP    2000-260189    9/2000

* cited by examiner

Primary Examiner—Richard T. Elms
Assistant Examiner—Allison P. Bernstein
(74) Attorney, Agent, or Firm—Oblon, Spivak, McClelland, Maier & Neustadt, P.C.

(57) ABSTRACT

In a data erasing method of a nonvolatile semiconductor memory device, cells are subjected to the processings of executing programming by applying a voltage to the cells to set their threshold values at a given level or more, erasing the cells to set their threshold values at a lower level or less, executing weak programming once on a cell whose threshold value is lower than a further lower level, by applying a lower voltage to the cell, repeating the weak programming on the cell when its threshold value is still lower than the further lower level, until the value reaches the further lower level or more, verifying whether a cell is present whose threshold value is higher than the lower level, and returning the processing to the processing of setting the threshold values of the cells at the lower level or less, when verifying that the above cell is present.

14 Claims, 12 Drawing Sheets

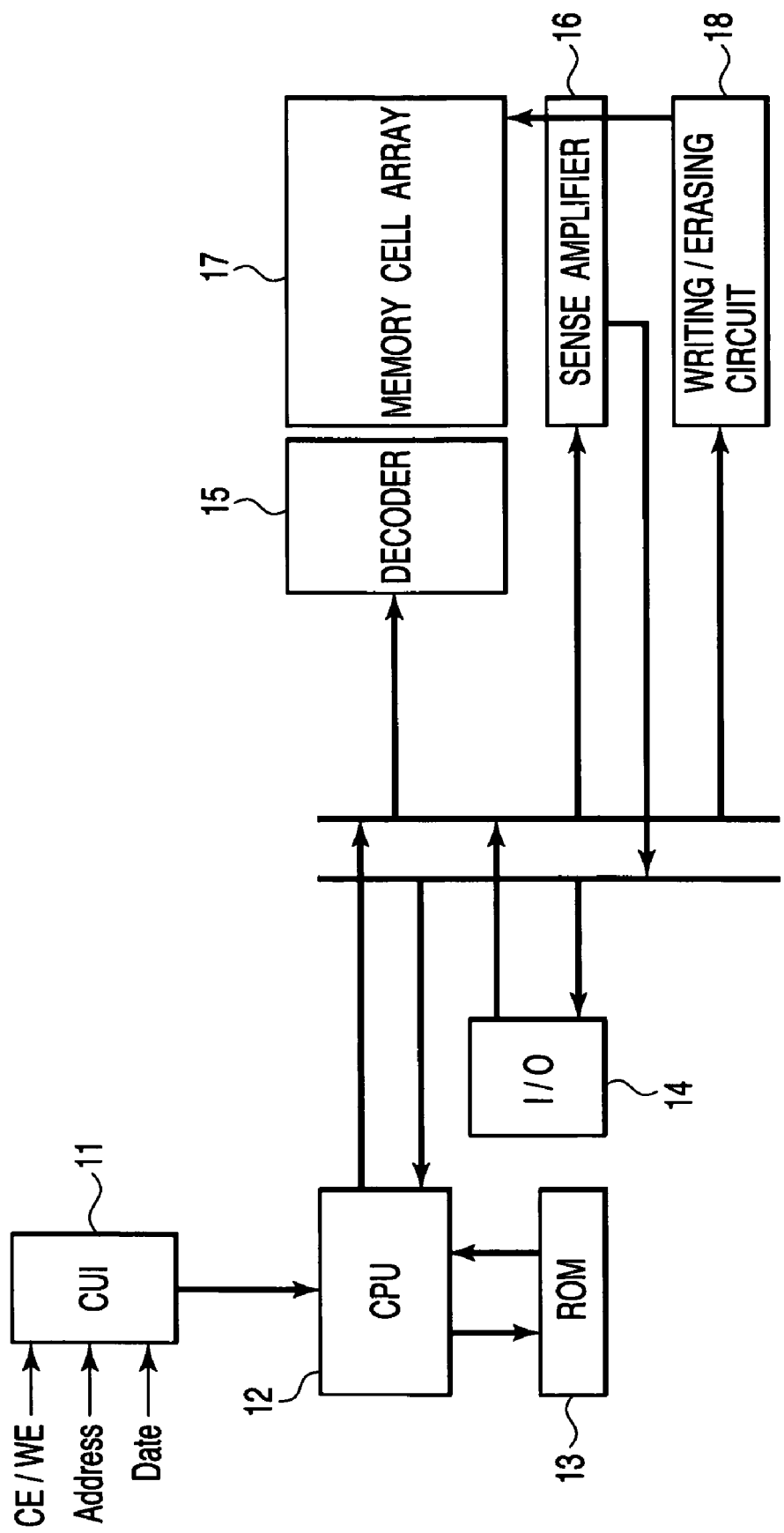
F I G. 6

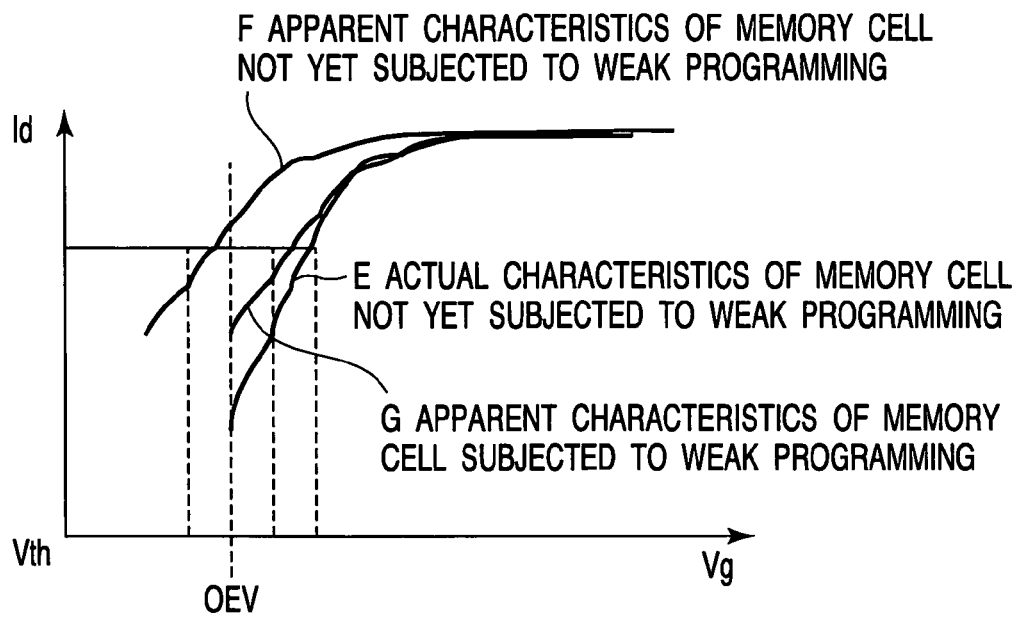
F I G. 14
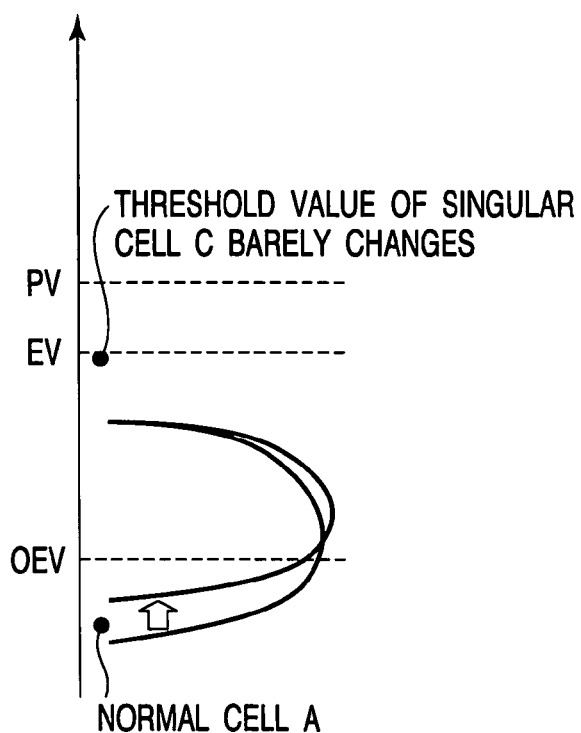
F I G. 15

NONVOLATILE SEMICONDUCTOR MEMORY DEVICE WHICH ERASES DATA IN UNITS OF ONE BLOCK INCLUDING A NUMBER OF MEMORY CELLS, AND DATA ERASING METHOD OF THE NONVOLATILE SEMICONDUCTOR MEMORY DEVICE

CROSS-REFERENCE TO RELATED APPLICATIONS

This application is based upon and claims the benefit of priority from prior Japanese Patent Application No. 2004-287700, filed Sep. 30, 2004, the entire contents of which are incorporated herein by reference.

BACKGROUND OF THE INVENTION

1. Field of the Invention

The present invention relates to a nonvolatile semiconductor memory device, and a data erasing method thereof. For example, the invention relates to a NOR type flash memory and an NAN flash memory, in both of which blocks each comprising a plurality of memory cells are provided, and a data erasing processing is performed in units of one block, and also to a data erasing method applied to those flash memories.

2. Description of the Related Art

In a nonvolatile semiconductor memory device, electrons are injected into or eliminated from a number of memory cells (each corresponding to 1-bit data), whereby the threshold values of the memory cells are changed, and the data stored in each memory cell indicates "1" or "0" (in the case where the memory cells store multivalue data, the injected charge can take one of four levels according to the stored data).

In general, in a nonvolatile semiconductor memory device referred to as a NOR type flash memory, in programming (writing) (in which electrons are injected into a memory cell or cells), a memory cell to which data can be written in units of 1 bit can be designated. This is because when a bit line and a word line are designated, and voltages are applied to the bit line and the word line, a bias is set to enable the above memory cell only to be subjected to the programming. However, in an actual nonvolatile semiconductor memory product, a number of bits are written as programming at the same time, i.e., a number of memory cells are subjected to the programming at the same time, in order that the programming be carried out at a higher speed.

On the other hand, in a data erasing operation, a bias is applied to a word line and a well region, and thus memory cells sharing the well region with each other are all erased as a data erasing processing (generally, the data erasing processing is executed in units of one block consisting of a number of memory cells). Thus, the data erasing processing of the nonvolatile semiconductor memory device comprises the following series of operations (steps), which will be explained with reference to FIG. 1, which is a flowchart of a series of step in a data erasing operation in a conventional nonvolatile semiconductor memory device.

First, in a block in which memory cells storing data indicating "1" (which are in an erased state) and memory cells storing data indicating "0" (which are in a programmed (written) state) are randomly present, only the memory cells storing the data indicating "1" are subjected to preprogramming (i.e., writing before the data erasing processing) in which the threshold value of a memory cell or cells to be processed is set to be equal to or higher than a voltage program verify (PV) level (step S101). FIG. 11A shows distribution of the threshold values of the memory cells not yet subjected to the above preprogramming, and FIG. 11B shows distribution of the threshold values of the memory cells subjected to the preprogramming.

Then, all the memory cells in the block are erased as a data erasing processing (step S102). In this processing, the threshold values of the memory cells are all lowered to be equal to or lower than a voltage erase verify (EV) level. FIG. 11C shows distribution of the memory cells subjected to the above data erasing processing.

However, actual memory cells vary in dimensions and thickness, etc. Thus, actually, of the above memory cells subjected to the above data erasing processing, a memory cell or cells are in an over-erased state in which their threshold values are lower than a voltage over erase verify (OEV) level. Therefore, weak programming is performed on a memory cell or cells determined to be in the over-erased state with respect to the voltage OEV level.

The following is the weak programming of the conventional nonvolatile memory device:

First, it is verified as a verifying processing whether or not the threshold value of each of the memory cells is equal to or higher than the voltage OEV level (step S103). When it is verified that the threshold value of a memory cell is lower than the voltage OEV level, i.e., the memory cell is in the over-erased state, it is subjected to the weak programming (step S104). This weak programming does not mean programming (writing) performed by applying a high voltage for making the data stored in the memory cell indicate "0", i.e., it means programming (writing) performed by applying a voltage lower than the high voltage to the drain and gate in the memory cell.

After being subjected to the weak programming in the above manner, the above memory cell is re-subjected to the verifying processing (step S103). Also, when it is verified that the threshold value of the memory cell is still lower than the voltage OEV level, and the memory cell is re-subjected to the weak programming (step S104). The verifying processing and the weak programming are repeated until it is verified that the threshold value of the memory cell is equal to or higher than the voltage OEV level. Then, when it is verified that the threshold value of the memory cell is equal to or higher than the voltage OEV level, the memory cell to be processed is changed from the above memory cell to a memory cell subsequent thereto (step S105).

After the weak programming on all the memory cells in the over-erased state in the block is completed (step S106), it is verified whether or not the threshold values of all the memory cells exceed the voltage EV level (step S107). Then, when there is no memory cell whose threshold value exceeds the voltage EV level, the data erasing processing ends. On the other hand, when there is a memory cell or cells the threshold values of which exceed the voltage EV level, the step is returned to the step S102 (data erase processing), and the steps are successively carried out from the step S102. Those series of steps are carried out as the steps in the data erasing operation in the conventional semiconductor memory device.

However, the above conventional semiconductor memory device has the following problem:

After the data erasing processing, there is a case where a singular memory cell (which will be hereinafter referred to a singular memory cell B) is present which is subjected to data erasing such that its threshold value is far lower than the voltage OEV level. This problem arises even in the case where the first threshold values of the memory cells are equalized by the preprogramming. It can be considered that the above problem occurs mainly due to abnormality in the shape of the above singular memory cell or the coupling ratio, etc.

To be more specific, if a singular memory cell B (whose threshold value is singularly low) is present, the following problem arises: in the weak programming, a leak current flows into the singular memory cell B, as a result of which even when the actual threshold value of a normal memory cell A located on the same bit line as the singular memory cell B is equal to or higher than the voltage OEV level, it is mistakenly verified that the threshold value of the normal memory cell A is lower than the actual threshold value thereof. This is because the threshold of a memory cell is verified based on the amount of current in the memory cell. Therefore, the normal memory cell A whose threshold value is actually equal to or higher than the voltage OEV level is subjected to the weak programming. At this time, a drain voltage (drain stress) at the writing time is applied to the drain in the singular memory cell B, and thus a small number of electrons are injected thereinto, increasing the threshold value of the singular memory cell B. In such a manner, the weak programming is repeated until a leak current is prevented from flowing into the singular memory cell B being in the over-erased state. If the normal memory cell A is a memory cell the threshold value of which is close to the voltage EV level as shown in FIG. 3, when it is repeatedly subjected to the weak programming due to the presence of the singular memory cell B, its threshold value exceeds the voltage EV.

Accordingly, in the verifying processing, it is verified that the threshold value of the normal memory cell A exceeds the voltage EV level, and the processing to be performed is returned to the data erasing processing. However, after the singular memory cell B is re-subjected to the data erasing processing, its threshold is greatly lowered, since its characteristics does not vary (i.e., they depend on its shape), and its erasing speed is high. In this case, the weak programming is repeated a number of times in the same manner as stated above. In such a manner, the data erasing operation enters an infinite loop, and thus does not end.

Actually, when a nonvolatile semiconductor memory product is checked with respect to production specification, if the time for the erasing operation exceeds a given time period, the product is determined to be defective. Thus, according to the conventional method, the fraction of defective nonvolatile semiconductor memory productions is increased.

Furthermore, the above infinite loop also occurs in the case where the data erasing processing is performed on the memory cells in a block including a singular memory cell (which will be hereinafter referred to as a singular memory cell C) whose erasing speed is very low. In this case, the data erasing processing is performed such that the threshold value of the singular memory cell C is equal to or lower than the voltage EV levels as shown in FIG. 4, as a result of which the threshold values of most of the other memory cells in the block are equal to or lower than the OEV level. In such a manner, since the threshold values of memory cells located on the same bit line as the singular memory cell C are equal to or lower than the voltage OEV level, a leak current at the OFF time is large. Consequently, when each of the above memory cells is subjected to the verifying processing, it is mistakenly determined that the threshold of each memory cell is lower than the actual threshold value thereof, and thus the weak programming is performed more times than necessary. At this time, since the singular memory cell C is located on the same bit line as the above memory cells, the threshold value of the singular memory cell C is increased by a drain stress. Then, similarly, the other memory cells are subjected to the weak programming, as a result of which the threshold value of the singular memory cell C are further increased to exceed the voltage EV level as shown in FIG. 5. In such a state, finally, when the singular memory cell C is subjected to the verifying processing, it is verified that the threshold value of the singular memory cell C exceeds the voltage EV level, and the processing to be performed is re-returned to the data erasing processing. As a result, the thresholds of most of the memory cells other than the singular memory cell C become equal to or lower than the voltage OEV level again. Thus, a leak current increases, and the weak programming is repeated more times than necessary, in the same manner as in the above case. In such a manner, the erasing operation enters an infinite loop, and does not end, thus increasing the fraction defective.

As explained above, in the erasing processing in a nonvolatile semiconductor memory product, if an infinite loop occurs in which the erasing processing and weak programming are repeated, the nonvolatile semiconductor memory product is determined to be defective. Therefore, if the method of the conventional nonvolatile semiconductor memory device is adopted, the fraction of defective nonvolatile semiconductor memory products is increased. Furthermore, even if an infinite loop does not occur in a nonvolatile semiconductor memory product, when the weak programming is performed more times than necessary, the time required for the erasing operation is increased, thus degrading the function of the product, and increasing the time for testing the product.

Jpn. Pat. Appln. KOKAI Publication No. 8-255489 discloses the following technique: after the memory cell transistors are all subjected to a data erasing processing, it is determined whether a memory cell transistor or transistors being in an over-erased state are present or not with respect to each of a plurality of digit lines. If it is determined that a memory cell transistor being in the over-erased state is present, the memory cell transistor is specified, and weak programming (writing) is performed on the memory cell transistor only.

BRIEF SUMMARY OF THE INVENTION

A data erasing method applied to a nonvolatile semiconductor memory device, according to an aspect of the present invention, comprises:

setting threshold values of a plurality of memory cells at a first predetermined voltage level or more by executing programming, the programming being executed by applying a voltage to the memory cells to;

setting the threshold values of the memory cells at a second predetermined voltage level or less, which is lower than the first predetermined voltage level, by executing a data erasing processing to the memory cells;

executing a weak programming only once by applying a voltage, which is lower than the voltage applied in the programming, to one or ones of the memory cells, the threshold values of which are lower than a third predetermined voltage level lower than the second predetermined voltage level;

repeatedly executing the weak programming on one or ones of the memory cells, the threshold values of which are still lower than the third predetermined voltage level after executing the weak programming only once, until the threshold value of the one or ones of the memory cells is set to be equal to or higher than the third predetermined voltage level; and verifying whether the memory cells include a memory cell or cells the threshold values of which are higher than the second predetermined voltage level, and returning processing to be executed to the setting the threshold values of the memory cells at the second predetermined voltage level or less, when verifying that the memory cells include the memory cell or cells the threshold values of which are higher than the second predetermined voltage level.

A data erasing method applied to a nonvolatile semiconductor device, according to another aspect of the present invention, comprises:

setting threshold values of a plurality of memory cells at a first predetermined voltage level or more by executing programming, the programming being executed by applying a voltage to the memory cells;

setting the threshold values of the memory cells at a second predetermined voltage level or less, which is lower than the first predetermined voltage level, by executing a data erasing processing to the memory cells;

executing a first weak programming only once by applying a voltage lower than the voltage applied in the programming to one or ones of the memory cells, the threshold values of which are lower than a third predetermined voltage level lower than the second predetermined voltage level;

executing a second weak programming by applying the voltage lower than the voltage applied in the programming to one or ones of the memory cells, the threshold values of which are still lower than the third predetermined voltage level after the first weak programming;

repeatedly executing a third weak programming by applying the voltage lower than the voltage applied in the programming to one or ones of the memory cells, the threshold values of which are still lower than the third predetermined voltage level after the second weak programming, until the threshold value of the one or ones of the memory cell is set to be equal to or higher than the third predetermined voltage level; and verifying whether or not the memory cells include a memory cell or cells the threshold values of which are higher than the second predetermined voltage, and returning processing to be executed to the setting the threshold values of the memory cells at the second predetermined voltage level or less, when verifying that the memory cells include the memory cell or cells the threshold values of which are higher than the second predetermined voltage.

A data erasing method applied to a nonvolatile semiconductor memory device, according to a further aspect of the present invention, for erasing all memory cells in a block included in a memory cell array comprising a plurality of blocks including the block, each of the blocks comprising memory cells, comprises:

setting threshold values of the memory cells in the block included in the memory cell array at a programming checking voltage level or more by applying a voltage to the memory cells in the block;

setting the threshold values of the memory cells in the block at an erasing checking voltage level or less, which is lower than the programming checking voltage level, by erasing all the memory cells in the block as a data erasing processing;

successively verifying the threshold values of the memory cells in the block, and (i) when verifying that the threshold value of one of the memory cells, which has been verified, is lower than an over-erasing checking voltage level lower than the erasing check voltage, executing a weak programming in which a voltage lower than the voltage applied in the programming is applied, on the one of the memory cells only once, and changing processing to be executed to verifying the threshold value of another one of the memory cells which is subsequent to the one of the memory cells, and (ii) when verifying that the threshold value of the one of the memory cells is equal to or higher than the over-erasing checking voltage level, changing the processing to be executed to the verifying the threshold value of the another one of the memory cells;

successively verifying the threshold values of the memory cells, and (i) when verifying that the threshold value of one of the memory cells, which has been verified, is lower than the over-erasing checking voltage level, repeatedly carrying out verifying the threshold values of the one of the memory cells and the weak programming on the one of the memory cells, until the threshold value of the one of the memory cells is set to be equal to or higher than the over-erasing checking voltage level, and changing the processing to be executed to verifying the threshold value of another one of the memory cells which is subsequent to the one of the memory cells, and (ii) when verifying that the threshold value of the one of the memory cells is equal to or higher than the over-erasing checking voltage level, changing the processing to be executed to verifying the threshold value of another one of the memory cells which is subsequent to the one of the memory cells; and verifying the threshold values of the memory cells, and when the threshold value of at least one of the memory cells is higher than the erasing checking voltage level, returning processing to be executed to the setting the threshold values of the memory cells at the erasing checking voltage level or less.

A nonvolatile semiconductor memory device according to a yet another aspect of the present invention, comprises:

a memory cell array including a plurality of blocks arranged therein and each including a plurality of memory cells;

a programming circuit which executes programming on the memory cells in one of the blocks; and an erasing circuit which erases all the memory cells in the one of the blocks as a data erasing processing; and a control circuit which issues a programming command and an erase command to the programming circuit and the erasing circuit, respectively, wherein the control circuit controls the processings of:

executing programming on the memory cells by applying a voltage thereto, to set the threshold values of the memory cells at a first predetermined voltage level or more;

setting the threshold values of the memory cells at a second predetermined voltage level or less, which is lower than the first predetermined voltage level, by subjecting the memory cells to the data erasing processing;

executing weak programming only once on one or ones of the memory cells, the threshold values of which are lower than a third predetermined voltage level lower than the second predetermined voltage level, by applying a voltage lower the voltage applied in the programming to the one or ones of the memory cells;

repeatedly executing the weak programming on one or ones of the memory cells, the threshold values of which are still lower than the third predetermined voltage after executing the weak programming only once, until the threshold hold value of the one or ones of the memory cells is set to be equal to or higher than the third predetermined voltage; and verifying whether or not the memory cells include a memory cell or cells the threshold values of which are higher the second predetermined voltage level, and returning processing to be executed to the processing of setting the threshold values of the memory cells at the second predetermined voltage level or less, when verifying that the memory cells include the memory cell or cells the threshold values of which are higher than the second predetermined voltage level.

A nonvolatile semiconductor memory device according to a still further aspect of the present invention, comprises:

a memory cell array including a plurality of blocks arranged therein and each including a plurality of memory cells;

a programming circuit which executes programming on the memory cells in one of the blocks; and an erasing circuit which erases all the memory cells in the one of the blocks as a data erasing processing; and a control circuit which issues a programming command and an erase command to the programming circuit and the erasing circuit, respectively, wherein the control circuit controls the processings of:

executing programming on the memory cells by applying a voltage thereto, to set the threshold values of the memory cells at a first predetermined voltage level or more;

setting the threshold values of the memory cells at a second predetermined voltage level or less, which is lower than the first predetermined voltage level, by subjecting the memory cells to the data erasing processing;

executing a first weak programming on one or ones of the memory cells, the threshold values of which are lower than a third predetermined voltage level lower than the second predetermined voltage level, by applying a voltage lower the voltage applied in the programming to the one or ones of the memory cells;

executing a second weak programming on one or ones of the memory cells, the threshold values of which are still lower than the third predetermined voltage level after the first weak programming, by applying the voltage lower than the voltage applied in the programming to the one or ones of the memory cells, repeatedly executing a third weak programming on one or ones of the memory cells, the threshold values of which are still lower than the third predetermined voltage after executing the second weak programming, by applying the voltage lower than the voltage applied in the programming to the one or ones of the memory cells, until the threshold hold value of the one or ones of the memory cells is set to be equal to or higher than the third predetermined voltage; and verifying whether or not the memory cells include a memory cell or cells the threshold values of which are higher than the second predetermined voltage level, and returning processing to be executed to the processing of setting the threshold values of the memory cells at the second predetermined voltage level or less, when verifying that the memory cells include the memory cell or cells the threshold values of which are higher than the second predetermined voltage level.

A nonvolatile semiconductor memory device according to an additional aspect of the present invention, comprises:

a memory cell array including a plurality of blocks arranged therein and each including a plurality of memory cells;

a programming circuit which executes programming on the memory cells in one of the blocks; and an erasing circuit which erases all the memory cells in the one of the blocks as a data erasing processing; and a control circuit which issues a programming command and an erase command to the programming circuit and the erasing circuit, respectively, wherein the control circuit controls the processings of:

executing programming on the memory cells by applying a voltage thereto, to set the threshold values of the memory cells at a programming checking voltage level or more;

setting the threshold values of the memory cells at an erasing checking voltage level or less, which is lower than the programming checking voltage level, by subjecting the memory cells in the one of the blocks to the data erasing processing;

successively verifying the threshold values of the memory cells in the on of the blocks, and (i) when verifying that the threshold value of one of the memory cells, which has been verified, is lower than an over-erasing checking voltage level lower than the erasing is check voltage level, executing a weak programming in which a voltage lower than the voltage applied in the programming is applied, on the one of the memory cells only once, and changing processing to be executed to verifying the threshold value of another one of the memory cells which is subsequent to the one of the memory cells, and (ii) when verifying that the threshold value of the one of the memory cells is equal to or higher than the over-erasing checking voltage level, changing the processing to be executed to the verifying the threshold value of the another one of the memory cells;

successively verifying the threshold values of the memory cells, and (i) when verifying that the threshold value of one of the memory cells, which has been verified, is lower than the over-erasing checking voltage level, repeatedly carrying out verifying the threshold values of the one of the memory cells and the weak programming on the one of the memory cells, until the threshold value of the one of the memory cells is set to be equal to or higher than the over-erasing checking voltage level, and changing the processing to be executed to verifying the threshold value of another one of the memory cells which is subsequent to the one of the memory cells, and (ii) when the threshold value of the one of the memory cells is equal to or higher than the over-erasing checking voltage level, changing the operation to be executed to verifying the threshold value of the another one of the memory cells; and verifying the threshold values of the memory cells, and when the threshold value of at least one of the memory cells is higher than the erasing checking voltage level, returning processing to be executed to the setting the threshold values of the memory cells at the erasing checking voltage level or less.

BRIEF DESCRIPTION OF THE SEVERAL VIEWS OF THE DRAWING

FIG. 6 is a block diagram of the structure of a nonvolatile semiconductor memory device according to the first embodiment of the present invention.

FIG. 14 is a view showing the characteristics of the normal memory cell A, which vary before and after it is subjected to the weak programming in the series of steps in the erasing operation with respect to threshold value (in the case where the singular memory cell B is present).

FIG. 15 is a view showing distribution of threshold values including the threshold values of the normal memory cell A and singular memory cell C, which are subjected to the data erasing processing in the series of steps in the erasing operation.

DETAILED DESCRIPTION OF THE INVENTION

Figure 1:
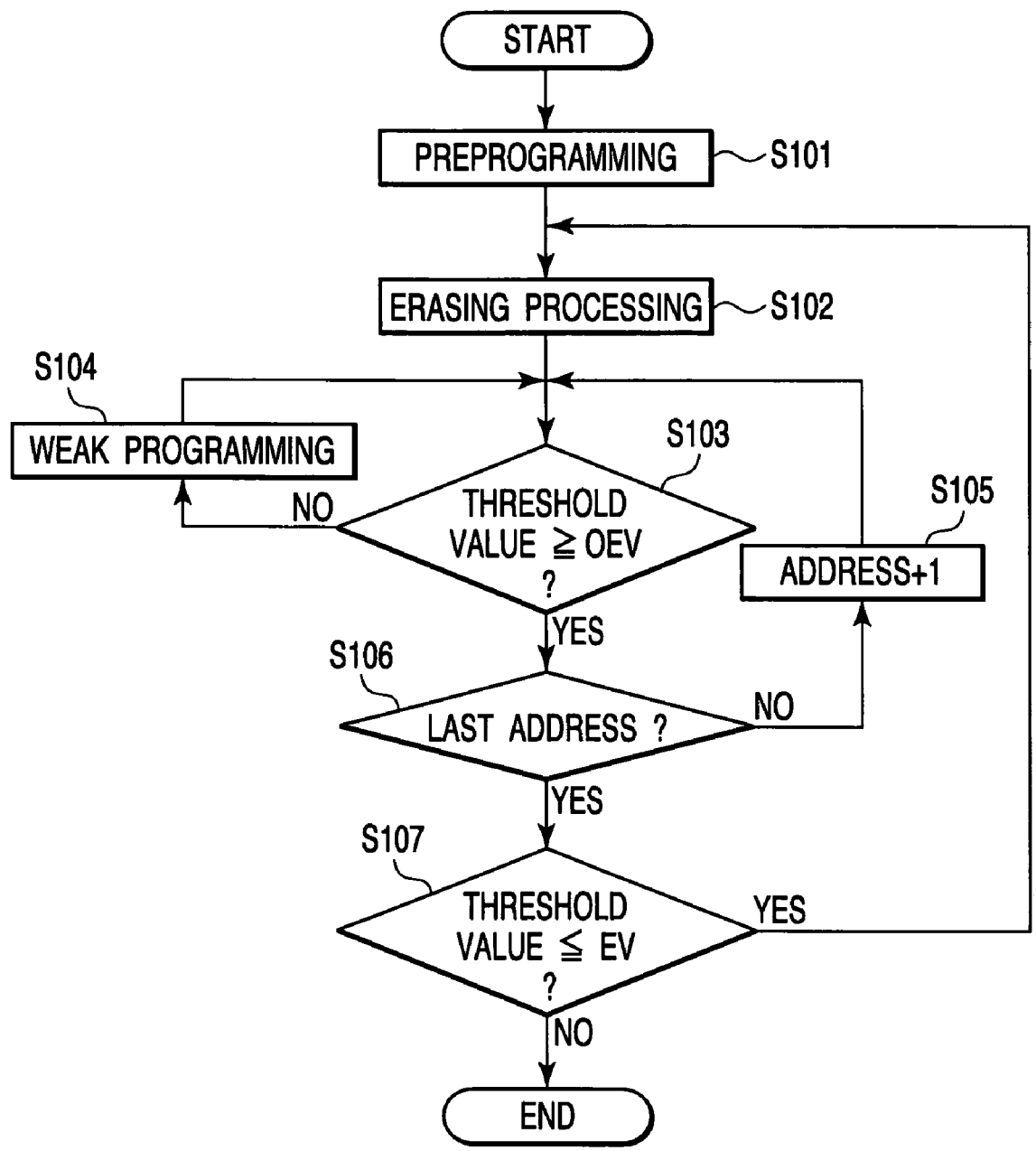
FIG. 1 is a flowchart of a series of steps in a data erasing operation in a conventional nonvolatile semiconductor memory device.

The embodiments of the present invention will be explained with reference to the accompanying drawings. In the following explanations, the same structural elements in the drawings will be denoted by the same reference numerals, respectively.

The First Embodiment

A nonvolatile semiconductor memory device according to the first embodiment of the present invention will be explained.

FIG. 6 is a block diagram of the structure of the nonvolatile semiconductor memory device according to the first embodiment.

The nonvolatile semiconductor memory device comprises a (command user interface (CUI) 11, a central processing unit (CPU) 12, a read-only memory (ROM) 13, an input/output circuit (I/O) 14, a decoder 15, a sense amplifier 16, a memory cell array 17 and a writing/erasing circuit 18.

The CUI 11 receives an address signal, data, and a chip enable signal CE or a write enable signal WE, which are input from the outside of the device, processes them, and outputs them to the CPU 12. The CPU 12 controls operations of the nonvolatile semiconductor memory, such as writing, erasing and reading operations. The ROM 13 is a memory for storing a control program to be used in the CPU 12. For example, when power is supplied to the CPU 12, a firmware (control program) stored in the EOM is loaded into the CPU 12, and a predetermined processing is executed by the CPU 12. Thereby, the CPU 12 produces various kinds of tables, or receives a write command, a read command or an erase command from the CUI 11, and executes access to a related area of the memory cell array 17 in response to the command.

The input/output circuit 14 inputs/outputs data to/from an external device. The decoder 15 selects a word line 16 connected to a memory cell indicated by an address signal, in response thereto. The sense amplifier 16 reads data stored in the memory cell, and outputs it to the input/output circuit 14 and the CPU 12. The writing/erasing circuit 18 writes data in the memory cell or erases data stored therein.

Figure 7:
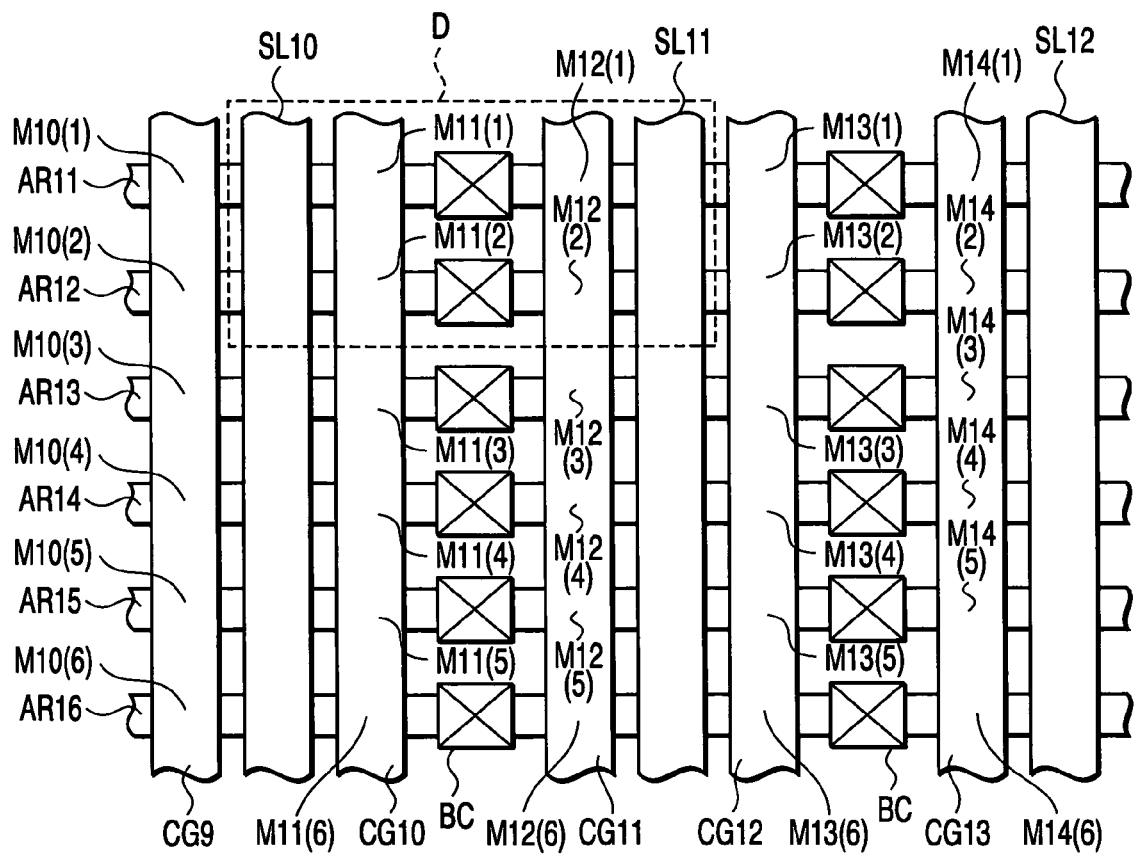
FIG. 7 shows the layout of a memory cell array in a NOR type semiconductor memory device according to the first embodiment.

In the memory cell array 17, a plurality of blocks each comprising a plurality of memory cells are provided. As an example of the memory cell 17, FIG. 7 shows part of the memory cell array in a NOR type semiconductor memory device. In the part shown in FIG. 7, control gate lines (word lines) CG9, CG 10, CG11, CG12 and CG13 are formed, and source lines SL10, SL11 and SL12 are formed parallel to the control gate lines. Furthermore, active areas AR11 to AR16 are formed perpendicular to the control gate lines. In areas where the control gate lines and the active areas intersect each other, memory cells M11(1) to M11(6), M12(1) to M12(6), M13(1) to M13(6), and M14(1) to M14(6) are formed. In addition, contact plugs BC are formed on drain areas between the control gate lines CG10 and CG11 and between the control gate lines CG12 and CG13.

Figure 8:
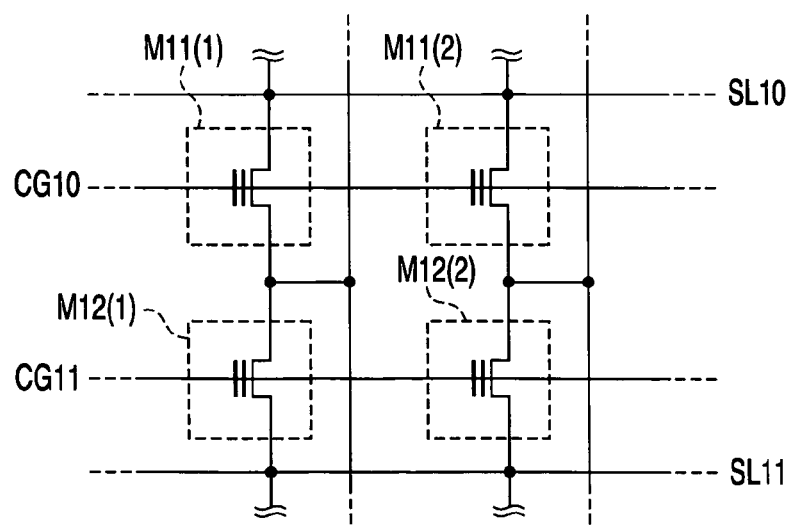
FIG. 8 is a circuit diagram of part of the memory cell array in the NOR type semiconductor memory device.

FIG. 8 is a circuit diagram of an area D of the memory cell array in FIG. 7.

With respect to the area D, the memory cells M11(1), M11(2), M12(1) and M12(2) comprise field effect transistors including floating gates. To the gates of the memory cells M11(1) and M11(2), the control gate line CG10 is connected. Similarly, to the gates of the memory cells M12(1) and M12(2), the control gate line CG11 is connected.

One end (drain) of a current path of the memory cell M11(1) is connected to one end (drain) of a current path of the memory cell M12(1), and to a contact point of these current paths, a bit line BL10 is connected. Similarly, one end (drain) of a current path of the memory cell M11(2) is connected to one end (drain) of a current path of the memory cell 12(2), and to a contact point of these current paths, a bit line BL11 is connected. Furthermore, to the other end of the current path of the memory cell M11(1) and the other end of the memory cell M11(2), a source line SL10 is connected. Similarly, to the other end of the memory cell M12(1), and to the other end of the memory cell M12(2), a source line SL 11 is connected.

Figure 9:
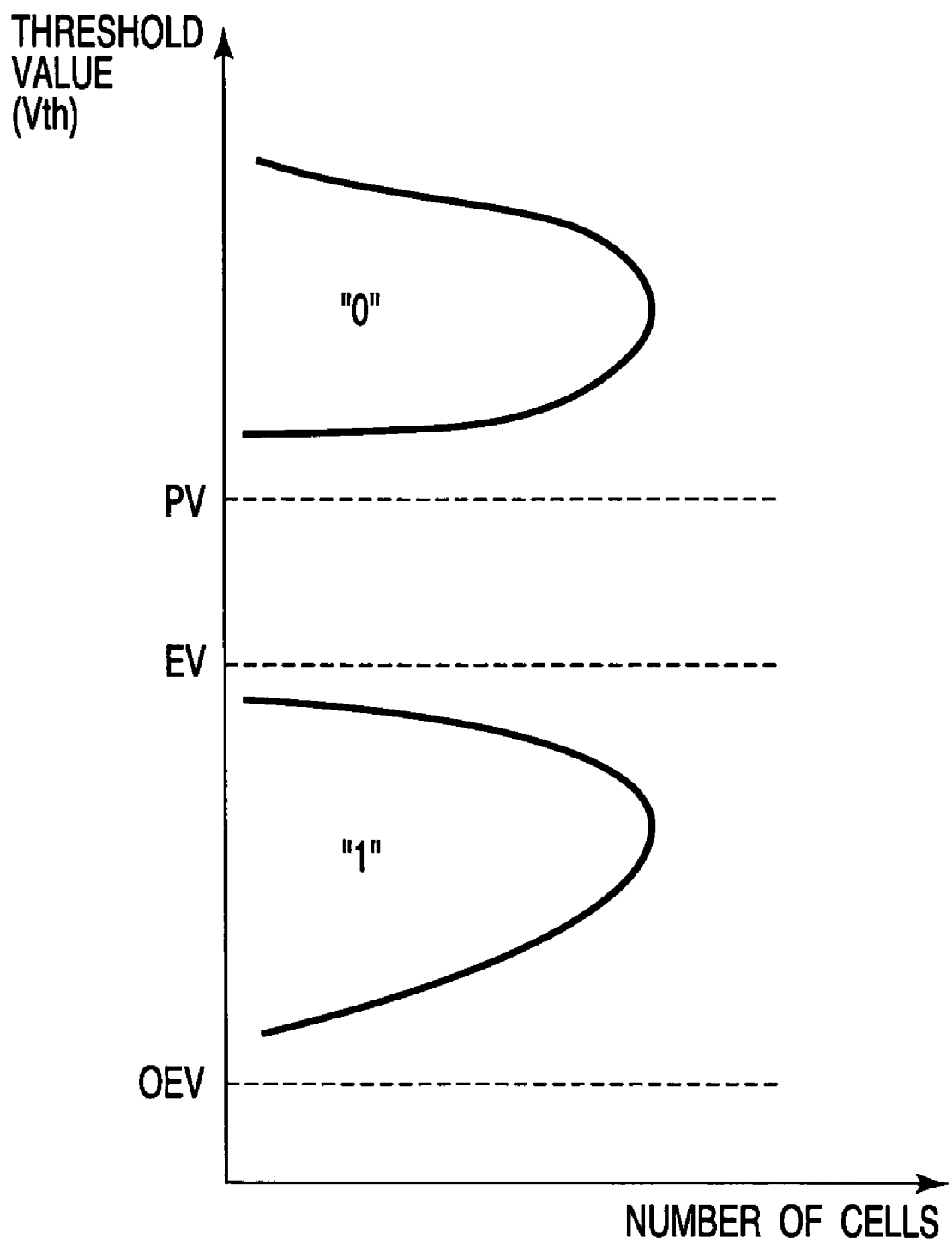
FIG. 9 shows the state of data in a memory cell in the NOR type semiconductor memory device, which varies with respect to the threshold value of the memory cell.

FIG. 9 shows the state of data in a memory cell in the NOR type semiconductor memory device, which varies with respect to the threshold value of the memory cell. The threshold value of the memory cell is changed by injecting or eliminating electrons into or from the memory cell, whereby the data stored in the memory cell indicates "1" or "0" as shown in FIG. 9 (it should be noted that data stored in one memory cell corresponds to 1-bit data). If the memory cell is a memory cell for storing, e.g., 2-bit data (multivalue data), the injected charge can take one of four levels according to the stored data.

Next, an erasing operation in the nonvolatile semiconductor memory device according to the first embodiment will be explained.

Figure 10:
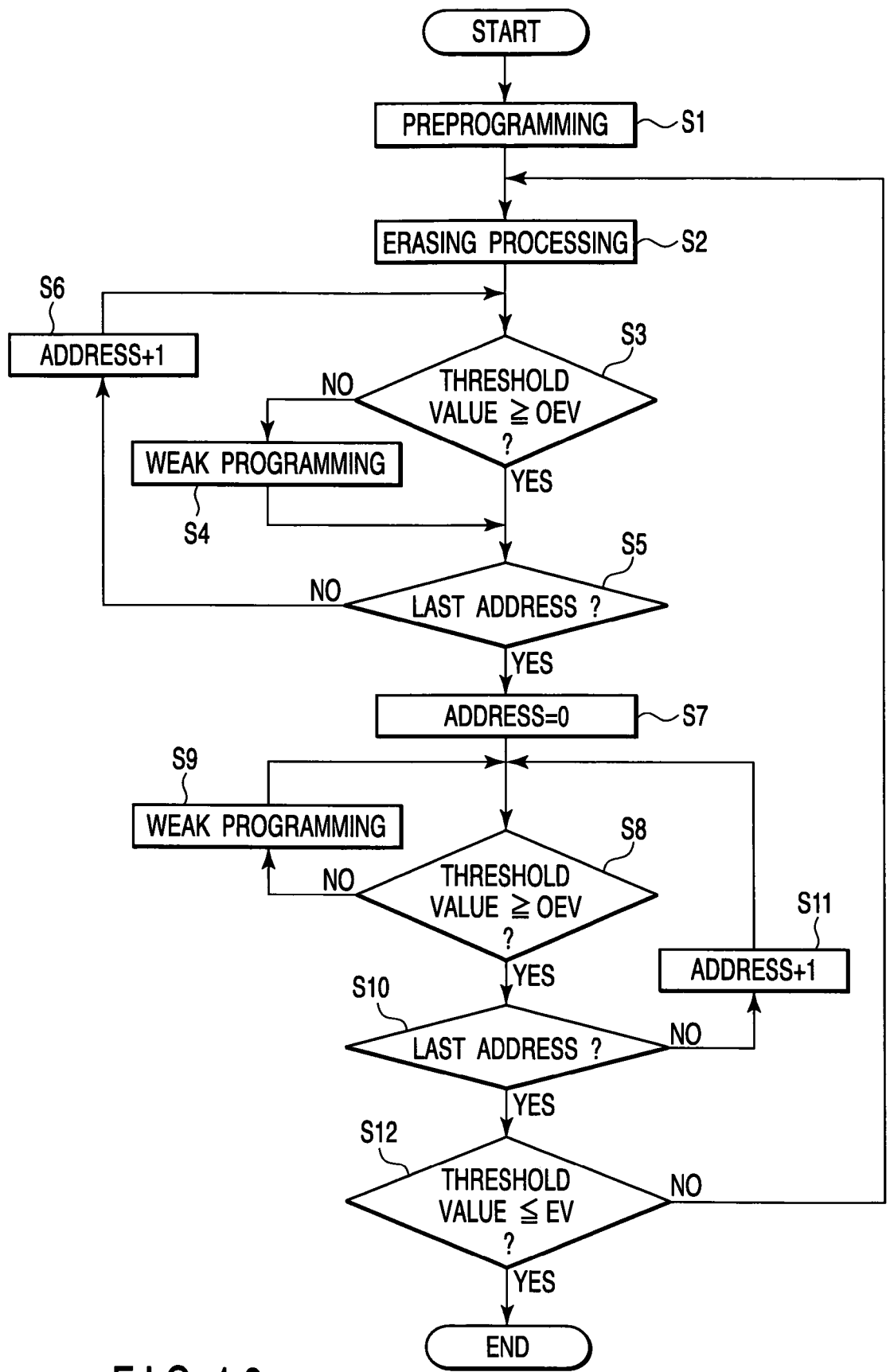
FIG. 10 is a flowchart of a series of steps in an erasing operation in the nonvolatile semiconductor memory device according to the first embodiment.

A control program for controlling the erasing operation is stored in the ROM 13. The CPU 12 reads the control program, and executes the following erasing operation:

FIG. 10 is a flowchart of a series of steps in the erasing operation in the nonvolatile semiconductor memory device according to the first embodiment.

Figure 11:
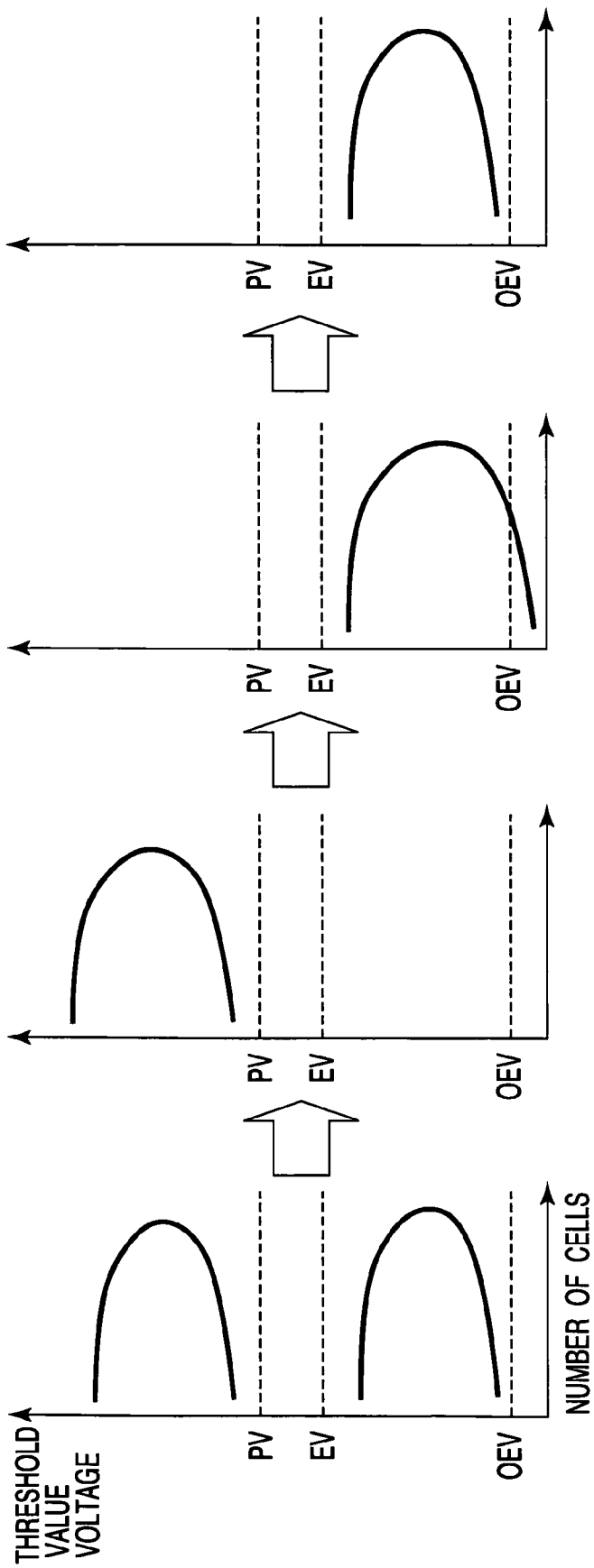
FIGS. 11A to 11D are views showing distribution of threshold values of memory cells, which are obtained in the series of steps in the erasing operation in the nonvolatile semiconductor memory device.

First, in the memory cell array 17, in a block wherein memory cells storing data indicating "1" (erased state) and those storing data indicating "0" (programmed (written) state) are randomly located, preprogramming (programming before erasing) is performed such that the threshold values of the memory cells storing the data indicating "1" become equal to or higher than a first predetermined threshold value (i.e., a voltage program verify (PV) level) (step S1). Thereby, the threshold values of all the memory cells in the above block are set to be equal to or higher than the voltage PV. The above preprogramming is performed in order to uniformize the states of electrons in the memory cells in the block, for the following reason: if the states of the electrons in the memory cells in the block are not uniform, i.e., memory cells whose data indicating "1" and those indicating "0" are present in the block, after the memory cells are erased as a data erasing processing subsequent to the above preprogramming, of the memory cells, a plurality of memory cells become in an over-erased state or an under-erased state. Consequently, the thresholds of the memory cells in the block are greatly different. FIGS. 11A and 11B show distribution of threshold values of memory cells which is obtained before the preprogramming and that obtained after the preprogramming, respectively.

Next, the memory cells in the block are subjected to the data erasing processing subsequent to the preprogramming (step S2). In this erasing processing, electrons are eliminated from all the memory cells in the block. Thereby, the threshold values of the memory cells are set to be equal to or less than a second threshold value (i.e., a voltage erase verify (EV) level). FIG. 11C shows distribution of the threshold values of the memory cells which is obtained after the above erasing processing.

However, actual memory cells vary in dimensions and film thickness, etc. Accordingly, after the actual memory cells are subjected to the above erasing processing, of the actual memory cells, a number of actual memory cells become in an over-erased state, i.e., their threshold values become too low. The memory cells being in the over-erased state causes a leak current at a reading time. If a larger number of memory cells become in the over-erased state, a leak current flows to a bit line, thus causing an error in reading. Thus, weak programming is performed to a memory cell or cells which are in the over-erased state, and the threshold values of which are lower than a third predetermined threshold value (i.e., voltage over erase verify (OEV) level). That is, if the threshold value of a memory cell or cells is lower than the third threshold value (voltage OEV level), the weak programming is performed on the memory cell or cells.

The above weak programming is divided into first and second weak programming processings.

First, the first weak programming processing will be explained.

In the first weak programming processing, it is verified as a verifying processing whether or not the threshold value of each of the memory cells in a block is equal to or higher than the voltage OEV (step S3). Then, when it is verified that the threshold value of a memory cell is lower than the voltage OEV level, i.e., the memory cell is in the over-erased state, the memory cell is subjected to the weak programming (step S4). It should be noted that the weak programming does not mean that a high voltage is applied to set the data in the memory cell at "0", i.e., it means programming (writing) performed by applying a voltage lower than the above high voltage to the drain and gate of the memory cell. For example, in ordinary programming (writing), the gate voltage Vg=9V, and the drain voltage Vd=5V, whereas in the weak programming, the gate voltage Vg=2 to 8V, and the drain voltage Vd=5V. That is, the gate voltage in the weak programming is lower than that in the normal programming.

In the conventional nonvolatile semiconductor memory device, after the weak programming is performed on a memory cell, the above verifying processing is performed, and when the threshold value of the memory cell is still lower than the voltage OEV level, the weak programming is re-performed on the memory cell. Those steps (i.e., the verifying processing and weak programming) are repeated until the threshold value of the memory cell becomes equal to or higher than the voltage OEV level. On the other hand, in the first embodiment, after the weak programming is performed on a memory cell, the verifying processing is not re-performed, and it is determined whether the address of the memory cell is the last address in the block or not (step S5). Then, it is determined whether it is not the last address, the memory cell to be verified is changed from the above memory cell to a memory cell subsequent thereto by incrementing the address number (step S6), and the step is returned to the step S3. Then, the steps S3 to S6 are repeated until it is verified that the address is the last address. The first weak programming processing comprises the above steps S3 to S6.

In such a manner, in the first weak programming processing (steps S3 to S6), each of all the memory cells in a block is subjected to the verifying processing to verify whether the threshold value of each memory cell is equal to or higher than the voltage OEV level, and when it is verified that the threshold value of a memory cell is lower than the voltage OEV level, the memory cell is subjected to the weak programming only one time. In such a manner, in the first weak programming processing, the number of times the weak programming is performed on one memory cell is one. Accordingly, when the first weak programming processing ends, a memory cell or cells are present the threshold values of which are still lower than the voltage OEV level. Therefore, the second weak programming processing is carried out.

The second weak programming processing will be explained.

In the step S5, when it is determined whether the address of a memory cell is the last address in the block, the address number is reset, and the memory cell to be verified is returned to a memory cell indicated by the first address in the block (step S7). Then, it is re-verified whether or not the threshold value of each of the memory cells in the block is equal to or higher than the voltage OEV level (step S8). When it is verified that the threshold value of a memory cell is lower than the voltage OEV level, i.e., the memory cell is in the over-erased state, it is subjected to the weak programming (step S9), and is then further re-subjected to the verifying processing (step S8). That is, in this case, the step is returned to the step S8. However, if it is verified that the threshold value of the above memory cell is still lower than the voltage OEV level, the memory cell is further re-subjected to the weak programming (step S9). In such a manner, the verifying processing and weak programming are repeated until it is verified that the threshold value of the memory cell is equal to or higher than the voltage OEV level. In the case where it is verified that the threshold value of the memory cell is equal to or higher than the voltage OEV level, it is determined whether or not the address of the memory cell is the last address in the block or not (step S10). When it is determined that the address of the memory cell is not the last address, the memory cell to be verified is changed from the above memory cell to a memory cell subsequent thereto by incrementing the address number (step S11), and the step is returned to the step S8. In such a manner, the steps S8 to S11 are repeatedly carried out until it is determined that the address of the memory cell is the last address. In such a manner, in the second weak programming processing, the memory cells in the block are successively subjected to the verifying processing, and if the threshold value of a memory cell is lower than the voltage OEV level, the weak programming is repeatedly performed on the memory cell, until the threshold value of the memory cell becomes equal to or higher than the voltage OEV level.

Next, when it is determined in the step S10 that the address of the memory cell is the last address in the block, i.e., the second weak programming processing on all the memory cells in the block is completed, the threshold values of the memory cells are all equal to or higher than the voltage OEV level. However, there is a possibility that a memory cell or cells may be present which have threshold values exceeding the voltage EV level. Thus, the threshold values of the memory cells are sequentially checked with respect to whether they are equal to or less than the voltage EV level (step S12). When it is determined that the threshold values of all the memory cells in the block does not exceed the voltage EV level, the data erasing operation ends. Thereby, the threshold values of all the memory cells in the block fall within a range between the voltage EV level and the voltage OEV level as shown in FIG. 1D. If even only one memory cell is present the threshold value of which is higher than the voltage EV level, the step is returned to the step S2 (the data erasing processing), and all the memory cells are subjected to the steps from the step S2.

In the first embodiment, of the memory cells in one block, a memory cell or cells being in the over-erased state are subjected to the weak programming only once, thus greatly lowering the possibility of causing an infinite loop, which is explained in the "Description of the Related Art" section. This is an advantage of the first embodiment.

Figure 12:
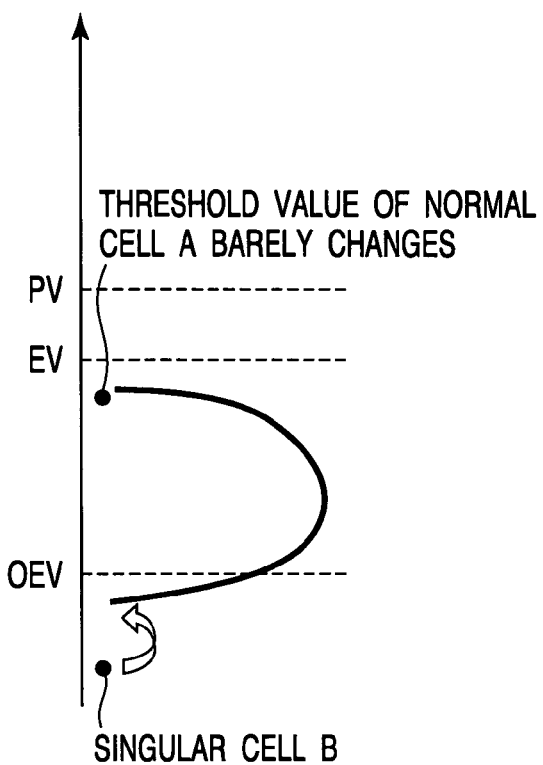
FIG. 12 is a view showing distribution of threshold values of a normal memory cell A and a singular memory cell B, which are subjected to the series of steps in the erasing operation.
Figure 13:
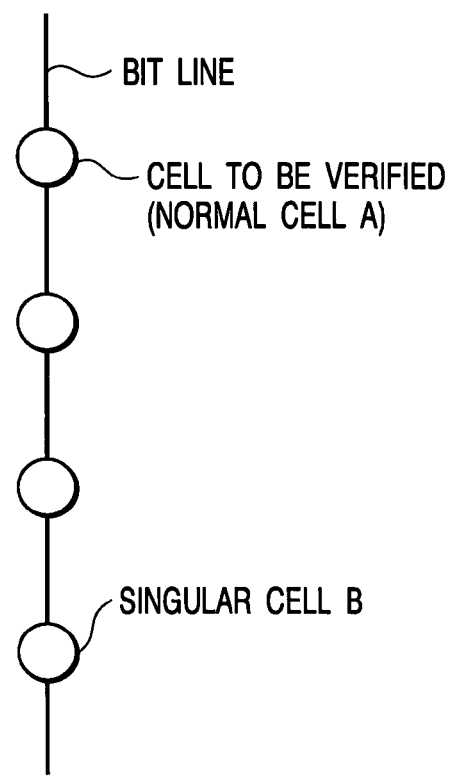
FIG. 13 is a view schematically showing the normal memory cell and singular memory cell B, which are connected to the same bit line.

This advantage can be obtained by the following operation:

Suppose a normal memory cell A having ordinary characteristics and a singular memory cell B whose erasing speed is high are both present as shown in FIG. 12, and the normal memory cell A and the singular memory cell B are connected to the same bit line as shown in FIG. 13. In this case, the threshold value of the singular memory cell B is lower than the voltage OEV level, and that of the normal memory cell A is higher than the voltage OEV level as shown in FIG. 14. However, since the normal memory cell A is located on the same bit line as the singular memory cell B, it is mistakenly determined that the normal memory cell A is in the over-erased state in which the threshold value is lower than the voltage OEV level, due to a leak current at the OFF time of the singular memory cell B, as shown in FIG. 14. In this case, in the first embodiment, the first weak programming processing is performed only once, and the memory cell to be processed is changed from the normal memory cell A to a memory cell subsequent thereto, thus preventing over-programming (over-writing) of the normal memory cell A. Also, each of all the memory cells whose threshold values are lower than the voltage OEV level is subjected to the weak programming only once. Thus, needless to say, the singular memory cell B is also subjected to the weak programming, thus decreasing the leak current at the OFF time. Thereby, when subsequent weak programming is performed, it is not mistakenly determined that the normal memory cell A located on the same bit line as the singular memory cell B is in the over-erased state in which the threshold value is lower than the voltage OEV level as indicated by a line G in FIG. 14. Accordingly, the weak programming is not performed more times than necessary, thus preventing occurrence of an infinite loop.

Figure 16:
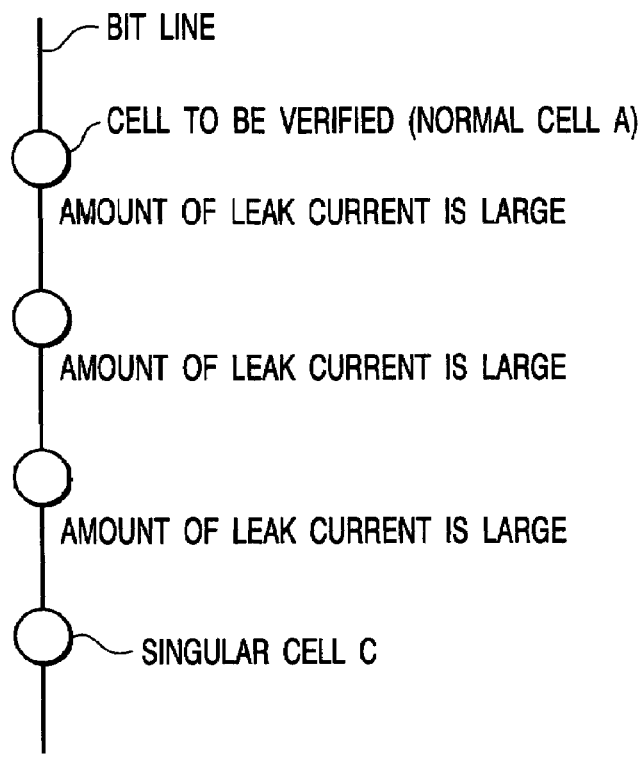
FIG. 16 is a view schematically showing the normal memory cell and the singular memory cell C, which are connected to the same bit line.
Figure 17:
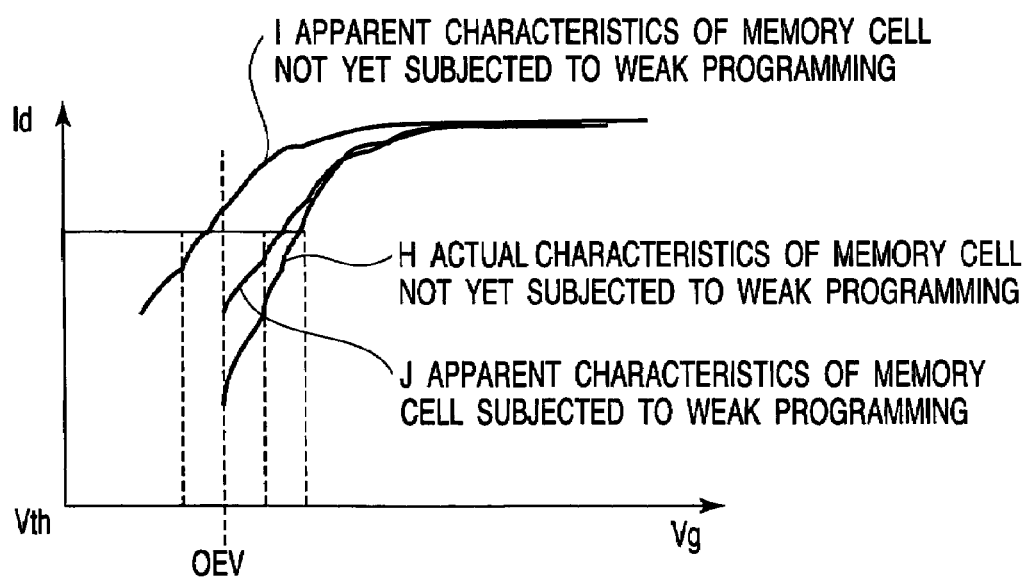
FIG. 17 is a view showing the characteristics of the normal memory cell A, which vary before and after it is subjected to the weak programming in the series of steps in the erasing operation with respect to threshold value (in the case where the singular memory cell is present).

Next, suppose a normal memory cell A and a singular memory cell C whose erasing speed is low are present as shown in FIG. 15, and they are connected on the same bit line as shown in FIG. 16. In such a manner, in the case where the singular memory cell C the erasing speed of which is low is present, in the data erasing processing, the other memory cells including the normal memory cell A are erased to a more degree than necessary, and a number of memory cells of the other memory cells become in the over-erased state, i.e., their threshold values becomes equal to or lower than the voltage OEV level. Accordingly, when the normal memory cell A is subjected to the verifying processing, the amount of the leak current at the OFF time is large, and it is mistakenly determined that the threshold value of the normal memory cell A, which is indicated as the apparent threshold value thereof by a line I in FIG. 17, is lower than the actual threshold value of the normal memory cell A. However, in the first embodiment, before changing the memory cell to be verified from the normal memory cell A to a memory cell subsequent thereto, the times the first weak programming processing is performed is only one, and therefore the programming is not executed more times than necessary. Accordingly, the number of times the weak programming is performed is decreased, and as a result the drain stress to the singular memory cell C is reduced, thus greatly reducing the probability of the threshold value of the singular memory cell C being equal to or higher than the EV level due to the programming. As a result, an infinite loop is prevented. It should be noted that a line H in FIG. 17 indicates the actual characteristics of the normal memory cell A not yet subjected to the weak programming, and a line J in FIG. 17 indicates the apparent characteristics of the normal memory cell A subjected to the weak programming once.

In such a manner, the first embodiment provides means for performing the weak programming on all the memory cells in a block, to prevent a time-out in the series of steps in the erasing operation, which would occur due to an infinite loop. Furthermore, it can be considered that in a nonvolatile semiconductor memory product manufactured by the method of the conventional nonvolatile semiconductor memory device, when writing and reading are repeated a large number of times, the characteristics of memory cells change, e.g., their erasing speeds become high or low, and an infinite loop occurs, which did not occur in a test carried out before shipment of the product. On the other hand, according to the first embodiment, the fraction of such defective nonvolatile semiconductor memory devices can be reduced. Furthermore, in the first embodiment, the time required for the erasing operation can be shortened, since the number of times the weak programming is unnecessarily performed can be reduced.

The Second Embodiment

A nonvolatile semiconductor memory device according to the second embodiment of the present invention will be explained. The block diagram of the structure of the nonvolatile semiconductor memory device according to the second embodiment is the same as that in FIG. 6, and its explanation will thus be omitted.

The data erasing operation of the nonvolatile semiconductor memory device according to the second embodiment will be explained.

Figure 18:
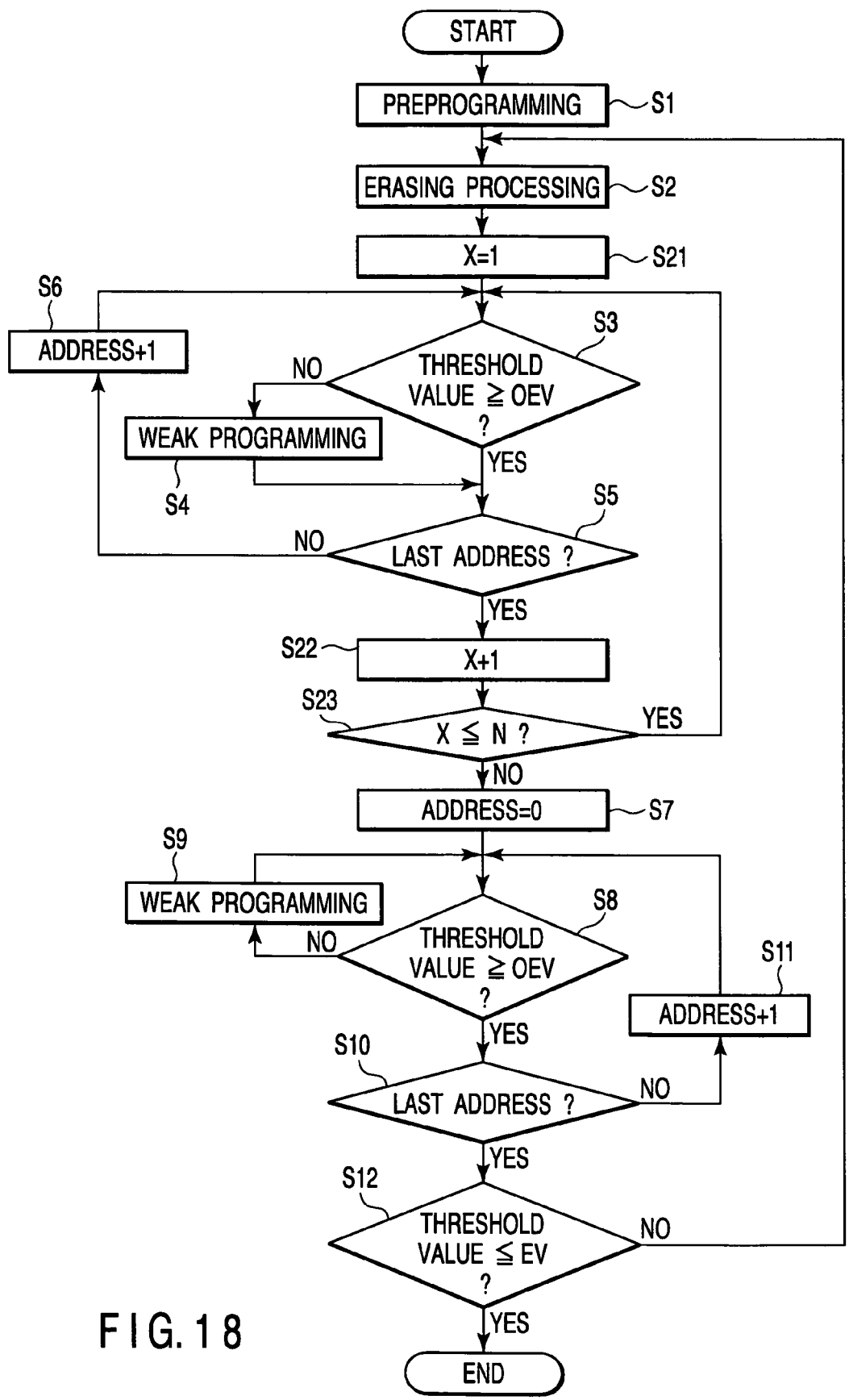
FIG. 18 is a flowchart of a series of steps in an erasing operation in a nonvolatile semiconductor memory device according to the second embodiment of the present invention.

In the second embodiment, a control program for controlling the erasing operation is stored in the ROM 13 as in the first embodiment. The CPU 12 reads the control program from the ROM 13, and executes the following erasing operation:

FIG. 18 is a flowchart showing a series of steps in the erasing operation in the nonvolatile semiconductor memory device according to the second embodiment.

First, in the memory cell array 17, in a block wherein memory cells storing data indicating "1" (erased state) and those storing data indicating "0" (programmed state) are randomly located, preprogramming (programming before erasing) is carried out such that the threshold values of the memory cells storing the data indicating "1" become equal to or higher than the first predetermined threshold value (the voltage program verify (PV) level) (step S1). Thereby, the threshold values of all the memory cells in the block are set to be equal to or higher than the voltage PV level.

Then, the memory cells in the block are all erased as the data erasing processing (step S2). Due to the data erasing processing, the threshold values of the memory cells are all set to be equal to or lower than the second predetermined threshold value (the voltage erase verify (EV) level).

However, as explained above, actual memory cells vary in dimensions and film thickness, etc. Accordingly, after the actual memory cells are subjected to the above erasing processing without verifying, of the actual memory cells, a number of actual memory cells become in the over-erased state, i.e., their threshold values become too low. The memory cells being in the over-erased state causes a leak current at a reading time. If a larger number of memory cells become in the over-erased state, a leak current flows to a bit line, thus causing an error in reading. Thus, the weak programming is performed to a memory cell or cells which are in the over-erased state, and the threshold values of which are lower than the third predetermined threshold value (the voltage over erase verify (OEV) level). That is, if the threshold value of a memory cell or cells is lower than the third threshold value (the voltage OEV level), the weak programming is performed on the memory cell br cells.

The weak programming is divided into three processings, i.e., the first weak programming processing, a programming number setting processing and the second weak programming processing.

First, the first weak programming processing will be explained.

In the first weak programming processing, a variable X is initialized to be set at "1" (step S21). Then, the memory cells in the block are successively subjected to the verifying processing, i.e., it is verified whether the threshold value of each of the memory cells in the block is equal to or higher than the voltage OEV level (step S3). If the threshold value of a memory cell is lower than the voltage OEV level, i.e., the memory cell is in the over-erased state, it is subjected to the weak programming (step S4). This weak programming does not mean programming performed by applying a high voltage for making the data in the memory cell indicate "0", i.e., it means programming performed by applying a voltage lower than the high voltage to the drain and gate in the memory cell, as explained with respect to the first embodiment.

In the conventional nonvolatile semiconductor memory cell, after being subjected to the weak programming, a memory cell is re-subjected to the verifying processing, and it is verified whether or not the threshold value of the memory cell is equal to or higher than the voltage OEV level. On the other hand, in the second embodiment, after subjected to the weak programming, a memory cell is not re-subjected to the verifying processing, and it is determined whether the address of the memory cell is the last address in the block or not (step S5). When it is determined that it is not the last address, the memory cell to be verified is changed from the above memory cell to a memory cell subsequent thereto by incrementing the address number (step S6), and the step is returned to the step S3. Then, the steps S3 to S6 are repeated until it is verified that the address is the last address. Those steps constitute the first weak programming processing.

In the first weak programming processing consisting of the steps S3 to S6, all the memory cells in the block are successively subjected to the verifying processing (i.e., it is verified whether or not the threshold value of each of the memory cells is equal to or higher than the voltage OEV level). Then, when it is verified that the threshold value of a memory cell is lower than the voltage OEV level, the memory cell is subjected to the weak programming only one time. However, in the first weak programming processing, the number of times the weak programming is performed on one memory cell is only one. Therefore, at this time, a memory cell or cells whose threshold values are lower than the voltage OEV level are present.

Then, the programming number setting processing will be explained. It is processing for setting the number of times the programming is performed.

In the programming number setting processing, when it is verified in the step S5 that the address of a memory cell is the last address, the variable X is incremented (step S22), and it is determined whether or not the increased viable X is equal to or smaller than a set value N (N=natural number of 1 or more) (step S23). The set value N is used in determining the number of times the first weak programming is performed in the steps S3 to S6. It should be noted that "X" is a positive integer (1, 2, 3, . . . N).

In the step S23, when it is determined that the incremented variable X is equal to or small than the set value N, the first weak programming in the step S3 to S6 is repeated until the variable X exceeds the set value N.

Next, the second weak programming will be explained.

In the step S23, when the variable X exceeds the set value N, the memory cell to be verified is returned to a memory cell indicated by the first address in the block (step S7). Then, the memory cells are successively subjected to the verifying processing from the memory cell indicated by the first address (in order to verify whether the threshold value of each memory cell is equal to or higher than the voltage OEV level) (step S8). When it is verified that the threshold value of a memory cell is lower than the voltage OEV level, i.e., the memory cell is in the over-erased state, it is subjected to the weak programming (step S9). Thereafter, the step is returned to the step S8, and the above memory cell is re-subjected to the verifying processing (step S8). When it is verified that the threshold value of the memory cell is still lower than the voltage OEV level, the memory cell is re-subjected to the weak programming (step S9). In such a manner, the verifying processing and the weak programming are repeated until the threshold value of the memory cell becomes equal to or higher than the voltage OEV level. When the threshold value of the memory cell becomes equal to or higher than the voltage OEV level, it is determined whether the address of the memory cell is the last address or not (step S10). When it is determined that the address of the memory cell is the not the last address, the memory cell to be verified is changed from the above memory cell to a memory cell subsequent thereto by incrementing the address number (step S11), and the step is returned to the step S8. In such a manner, the steps S8 to S11 are repeatedly carried out until it is determined that the address of the memory cell is the last address. As explained above, in the second weak programming, each of the memory cells in the block is subjected to the verifying processing, and the weak programming is repeated until its threshold value becomes equal to or higher than the voltage OEV level as occasion arises.

Next, in the step S10, it is determined that the address of the memory cell is the last address, i.e., after the second weak programming performed on all the memory cells in the block is completed, the threshold values of all the memory cells are equal to or higher than the voltage OEV level, but there is a possibility that a memory cell or cells whose threshold values exceeds the voltage EV level may be present. Thus, it is determined whether or not the threshold value of each memory cell is equal to or lower than the voltage EV (step 12). Then, when the threshold values of all the memory cells in the block are equal to or lower than the voltage EV level, the erasing operation ends. Thereby, the threshold values of all the memory cells fall within the range between the voltage EV and OEV levels. If even one memory cell, whose threshold value is higher than the voltage EV, is present, the step is returned to the step S2 (the data erasing processing), and the steps are carried out from the step S2 again.

The second embodiment is different from the first embodiment on the point wherein the steps of subjecting the memory cells in a block to the verifying processing and of subjecting the memory cells to the weak programming only once are repeated a number of times. It should be noted that in the first embodiment, the number of times the weak programming is performed on one memory cell is only one time.

Figure 2:
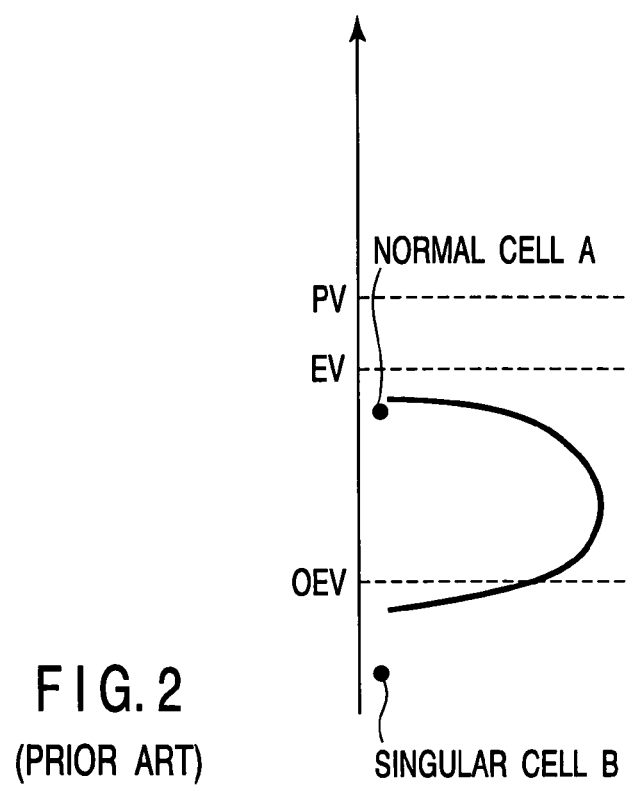
FIG. 2 is a view showing distribution of threshold values of a normal memory cell A and a singular memory cell B, which are erased in a data erasing processing in the series of steps in the conventional nonvolatile semiconductor memory device.
Figure 3:
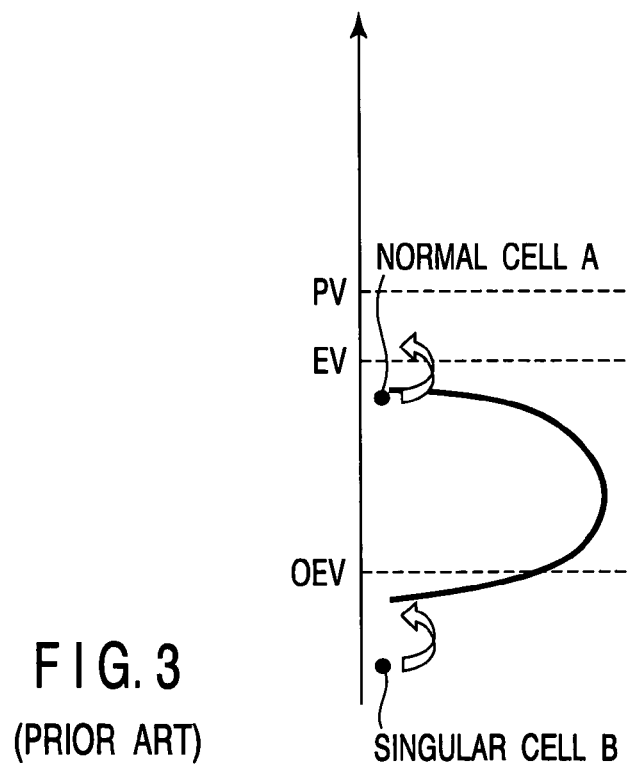
FIG. 3 is a view showing a change of the threshold value of each of the normal memory cell A and the singular memory cell B due to weak programming in the series of steps in the conventional nonvolatile semiconductor memory device.
Figure 4:
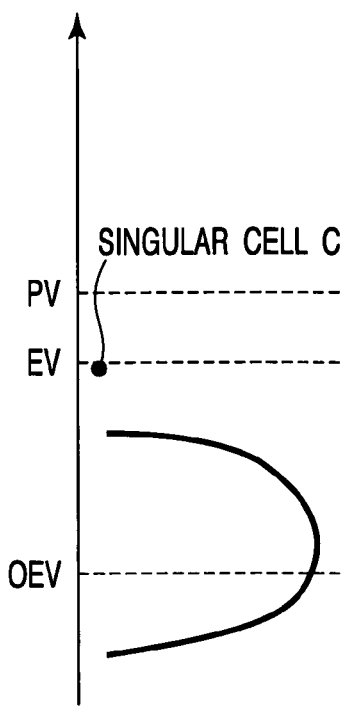
FIG. 4 is a view showing distribution of threshold values including the threshold value of a singular memory cell C subjected to the data erasing processing in the series of steps in the conventional nonvolatile semiconductor memory device.
Figure 5:
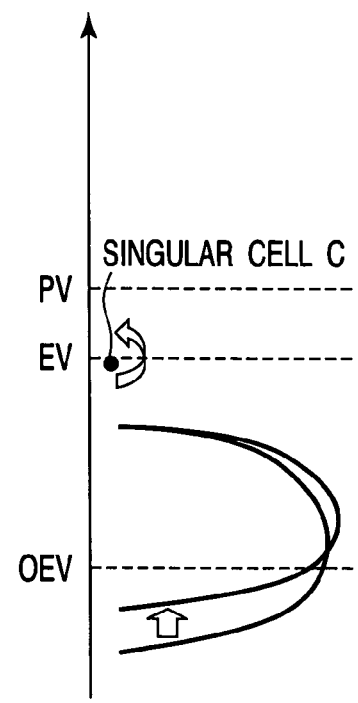
FIG. 5 is a view showing a change of the threshold value of the singular memory cell C due to the weak programming in the series of steps in the conventional nonvolatile semiconductor memory device.

According to the second embodiment, the following advantages are obtained:

If a singular cell B having a high erasing speed is present as shown in FIG. 2, there is a case where when the weak programming is performed only once, the leak current at the OFF time cannot be reduced. On the other hand, in the second embodiment, since the weak programming in the steps S3 to S6 is performed a number of times, i.e., memory cells being in the over-erased state in a block are all subjected to the weak programming a number of times, the singular cell B is set in a programmed state such that its threshold value is set at a higher level. This feature can reduce occurrence of an infinite loop (ping-pong mode) in which the data erasing processing and weak programming are repeated endlessly. It should be noted that unlike the conventional nonvolatile semiconductor memory device, in the second embodiment, the number of times the weak programming is performed is limited, and also that the time required for the erasing operation in the first embodiment is shorter than that in the second embodiment.

Whether to adopt the first embodiment or the second embodiment depends on the characteristics of the memory cells to be erased. That is, the characteristics of the memory cells need to be ascertained to select the first embodiment or the second embodiment. According to circumstances, a step of selecting the first or the second embodiment by using an option ROM, etc. may be provided in a production test.

As explained above, according to the embodiments of the present invention, at the data erasing time, an infinite loop in which erasing and programming are repeated endlessly can be prevented. Therefore, as compared with the conventional method, the present invention can reduce the fraction of defective nonvolatile semiconductor memory products can be reduced, and prevent degradation of the functions of nonvolatile semiconductor memory products, and shorten the time for testing the products.

Furthermore, the embodiments can be put to practical use, either alone or in combination. In addition, the embodiments contain various inventive aspects at different levels. Thus, a number of inventions at different levels can be extracted by properly selectively combining the structural elements disclosed above with respect to the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data erasing method applied to a nonvolatile semiconductor memory device, comprising:
setting threshold values of a plurality of memory cells at a first predetermined voltage level or more by executing programming, the programming being executed by applying a voltage to the memory cells;
setting the threshold values of the memory cells at a second predetermined voltage level or less, which is lower than the first predetermined voltage level, by executing a data erasing processing to the memory cells;
executing a weak programming only once by applying a voltage, which is lower than the voltage applied in the programming, to one or ones of the memory cells, the threshold values of which are lower than a third predetermined voltage level lower than the second predetermined voltage level;
repeatedly executing the weak programming on one or ones of the memory cells, the threshold values of which are still lower than the third predetermined voltage level after executing the weak programming only once, until the threshold value of said one or ones of the memory cells is set to be equal to or higher than the third predetermined voltage level; and
verifying whether the memory cells include a memory cell or cells the threshold values of which are higher than the second predetermined voltage level, and returning processing to be executed to the setting the threshold values of the memory cells at the second predetermined voltage level or less, when verifying that the memory cells include the memory cell or cells the threshold values of which are higher than the second predetermined voltage level.

2. The data erasing method according to claim 1, wherein each of the memory cells comprises a field-effect transistor comprising a control gate, a floating gate, a source and a drain, and in the weak programming, the voltage lower than the voltage applied in the programming is applied to at least one of the control gate and the drain of the field-effect transistor of said each memory cell to rise the threshold value of said each memory cell by a smaller level than in the programming.

3. A data erasing method applied to a nonvolatile semiconductor device, comprising:
setting threshold values of a plurality of memory cells at a first predetermined voltage level or more by executing programming, the programming being executed by applying a voltage to the memory cells;
setting the threshold values of the memory cells at a second predetermined voltage level or less, which is lower than the first predetermined voltage level, by executing a data erasing processing to the memory cells;
executing a first weak programming only once by applying a voltage lower than the voltage applied in the programming to one or ones of the memory cells, the threshold values of which are lower than a third predetermined voltage level lower than the second predetermined voltage level;
executing a second weak programming by applying the voltage lower than the voltage applied in the programming to one or ones of the memory cells, the threshold values of which are still lower than the third predetermined voltage level after the first weak programming;
repeatedly executing a third weak programming by applying the voltage lower than the voltage applied in the programming to one or ones of the memory cells, the threshold values of which are still lower than the third predetermined voltage level after the second weak programming, until the threshold value of said one or ones of the memory cell is set to be equal to or higher than the third predetermined voltage level; and
verifying whether or not the memory cells include a memory cell or cells the threshold values of which are higher than the second predetermined voltage, and returning processing to be executed to the setting the threshold values of the memory cells at the second predetermined voltage level or less, when verifying that the memory cells include the memory cell or cells the threshold values of which are higher than the second predetermined voltage.

4. The data erasing method according to claim 3, wherein the second weak programming is performed a number of times on said one or ones of the memory cells the threshold values of which are still lower than the third predetermined voltage level after the first weak programming.

5. The data erasing method according to claim 3, wherein each of the memory cells comprises a field-effect transistor comprising a control gate, a floating gate, a source and a drain, and in the weak programming, the voltage lower than the voltage applied in the programming is applied to at least one of the control gate and the drain of the field-effect transistor of said each memory cell to rise the threshold value of said each memory cell by a smaller level than in the programming.

6. A data erasing method applied to a nonvolatile semiconductor memory device, for erasing all memory cells in a block included in a memory cell array comprising a plurality of blocks including the block, each of the blocks comprising memory cells, the data erasing method comprising:
setting threshold values of the memory cells in the block included in the memory cell array at a programming checking voltage level or more by applying a voltage to the memory cells in the block;
setting the threshold values of the memory cells in the block at an erasing checking voltage level or less, which is lower than the programming checking voltage level, by erasing all the memory cells in the block as a data erasing processing;
successively verifying the threshold values of the memory cells in the block, and (i) when verifying that the threshold value of one of the memory cells, which has been verified, is lower than an over-erasing checking voltage level lower than the erasing check voltage, executing a weak programming in which a voltage lower than the voltage applied in the programming is applied, on said one of the memory cells only once, and changing processing to be executed to verifying the threshold value of another one of the memory cells which is subsequent to said one of the memory cells, and (ii) when verifying that the threshold value of said one of the memory cells is equal to or higher than the over-erasing checking voltage level, changing the processing to be executed to the verifying the threshold value of said another one of the memory cells;
successively verifying the threshold values of the memory cells, and (i) when verifying that the threshold value of one of the memory cells, which has been verified, is lower than the over-erasing checking voltage level, repeatedly carrying out verifying the threshold values of said one of the memory cells and the weak programming on said one of the memory cells, until the threshold value of said one of the memory cells is set to be equal to or higher than the over-erasing checking voltage level, and changing the processing to be executed to verifying the threshold value of another one of the memory cells which is subsequent to said one of the memory cells, and (ii) when verifying that the threshold value of said one of the memory cells is equal to or higher than the over-erasing checking voltage level, changing the processing to be executed to verifying the threshold value of another one of the memory cells which is subsequent to said one of the memory cells; and
verifying the threshold values of the memory cells, and when the threshold value of at least one of the memory cells is higher than the erasing checking voltage level, returning processing to be executed to the setting the threshold values of the memory cells at the erasing checking voltage level or less.

7. The data erasing method according to claim 6, wherein each of the memory cells comprises a field-effect transistor comprising a control gate, a floating gate, a source and a drain, and in the weak programming, the voltage lower than the voltage applied in the programming is applied to at least one of the control gate and the drain of the field-effect transistor of said each memory cell to rise the threshold value of said each memory cell by a smaller level than that of said each memory cell in the programming.

8. A nonvolatile semiconductor memory device comprising:

a memory cell array including a plurality of blocks arranged therein and each including a plurality of memory cells;

a programming circuit which executes programming on the memory cells in one of the blocks; and an erasing circuit which erases all the memory cells in said one of the blocks as a data erasing processing; and a control circuit which issues a programming command and an erase command to the programming circuit and the erasing circuit, respectively, wherein the control circuit controls the processings of:

executing programming on the memory cells by applying a voltage thereto, to set the threshold values of the memory cells at a first predetermined voltage level or more;

setting the threshold values of the memory cells at a second predetermined voltage level or less, which is lower than the first predetermined voltage level, by subjecting the memory cells to the data erasing processing;

executing weak programming only once on one or ones of the memory cells, the threshold values of which are lower than a third predetermined voltage level lower than the second predetermined voltage level, by applying a voltage lower the voltage applied in the programming to said one or ones of the memory cells;

repeatedly executing the weak programming on one or ones of the memory cells, the threshold values of which are still lower than the third predetermined voltage after executing the weak programming only once, until the threshold hold value of said one or ones of the memory cells is set to be equal to or higher than the third predetermined voltage; and verifying whether or not the memory cells include a memory cell or cells the threshold values of which are higher than the second predetermined voltage level, and returning processing to be executed to the processing of setting the threshold values of the memory cells at the second predetermined voltage level or less, when verifying that the memory cells include the memory cell or cells the threshold values of which are higher than the second predetermined voltage level.

9. The nonvolatile semiconductor memory device according to claim 8, wherein each of the memory cells comprises a field-effect transistor comprising a control gate, a floating gate, a source and a drain, and in the weak programming, the voltage lower than the voltage applied in the programming is applied to at least one of the control gate and the drain of the field-effect transistor of said each memory cell to rise the threshold value of said each memory cell by a smaller level than in the programming.

10. A nonvolatile semiconductor memory device comprising:

a memory cell array including a plurality of blocks arranged therein and each including a plurality of memory cells;

a programming circuit which executes programming on the memory cells in one of the blocks; and an erasing circuit which erases all the memory cells in said one of the blocks as a data erasing processing; and a control circuit which issues a programming command and an erase command to the programming circuit and the erasing circuit, respectively, wherein the control circuit controls the processings of:

executing programming on the memory cells by applying a voltage thereto, to set the threshold values of the memory cells at a first predetermined voltage level or more;

setting the threshold values of the memory cells at a second predetermined voltage level or less, which is lower than the first predetermined voltage level, by subjecting the memory cells to the data erasing processing;

executing a first weak programming on one or ones of the memory cells, the threshold values of which are lower than a third predetermined voltage level lower than the second predetermined voltage level, by applying a voltage lower the voltage applied in the programming to said one or ones of the memory cells;

executing a second weak programming on one or ones of the memory cells, the threshold values of which are still lower than the third predetermined voltage level after the first weak programming, by applying the a voltage lower than the voltage applied in the programming to said one or ones of the memory cells, repeatedly executing a third weak programming on one or ones of the memory cells, the threshold values of which are still lower than the third predetermined voltage after executing the second weak programming, by applying the voltage lower than the voltage applied in the programming to said one or ones of the memory cells, until the threshold hold value of said one or ones of the memory cells is set to be equal to or higher than the third predetermined voltage; and verifying whether or not the memory cells include a memory cell or cells the threshold values of which are higher than the second predetermined voltage level, and returning processing to be executed to the processing of setting the threshold values of the memory cells at the second predetermined voltage level or less, when verifying that the memory cells include the memory cell or cells the threshold values of which are higher than the second predetermined voltage level.

11. The nonvolatile semiconductor memory device according to claim 10, wherein the second weak programming is repeated a number of times when the threshold values of said one or ones of the memory cells are still lower than the third predetermined voltage level after the first weak programming.

12. The nonvolatile semiconductor memory device according to claim 10, wherein each of the memory cells comprises a field-effect transistor comprising a control gate, a floating gate, a source and a drain, and in the weak programming, the voltage lower than the voltage applied in the programming is applied to at least one of the control gate and the drain of the field-effect transistor of said each memory cell to rise the threshold value of said each memory cell by a smaller level than that of said each memory cell in the programming.

13. A nonvolatile semiconductor memory device comprising:

a memory cell array including a plurality of blocks arranged therein and each including a plurality of memory cells;

a programming circuit which executes programming on the memory cells in one of the blocks; and an erasing circuit which erases all the memory cells in said one of the blocks as a data erasing processing; and a control circuit which issues a programming command and an erase command to the programming circuit and the erasing circuit, respectively, wherein the control circuit controls the processings of:
executing programming on the memory cells by applying a voltage thereto, to set the threshold values of the memory cells at a programming checking voltage level or more;
setting the threshold values of the memory cells at an erasing checking voltage level or less, which is lower than the programming checking voltage level, by subjecting the memory cells in said one of the blocks to the data erasing processing;
successively verifying the threshold values of the memory cells in said on of the blocks, and (i) when verifying that the threshold value of one of the memory cells, which has been verified, is lower than an over-erasing checking voltage level lower than the erasing check voltage level, executing a weak programming in which a voltage lower than the voltage applied in the programming is applied, on said one of the memory cells only once, and changing processing to be executed to verifying the threshold value of another one of the memory cells which is subsequent to said one of the memory cells, and (ii) when verifying that the threshold value of said one of the memory cells is equal to or higher than the over-erasing checking voltage level, changing the processing to be executed to the verifying the threshold value of said another one of the memory cells;
successively verifying the threshold values of the memory cells, and (i) when verifying that the threshold value of one of the memory cells, which has been verified, is lower than the over-erasing checking voltage level, repeatedly carrying out verifying the threshold values of said one of the memory cells and the weak programming on said one of the memory cells, until the threshold value of said one of the memory cells is set to be equal to or higher than the over-erasing checking voltage level, and changing the processing to be executed to verifying the threshold value of another one of the memory cells which is subsequent to said one of the memory cells, and (ii) when the threshold value of said one of the memory cells is equal to or higher than the over-erasing checking voltage level, changing the operation to be executed to verifying the threshold value of said another one of the memory cells; and
verifying the threshold values of the memory cells, and when the threshold value of at least one of the memory cells is higher than the erasing checking voltage level, returning processing to be executed to the setting the threshold values of the memory cells at the erasing checking voltage level or less.

14. The nonvolatile semiconductor memory device according to claim 13, wherein each of the memory cells comprises a field-effect transistor comprising a control gate, a floating gate, a source and a drain, and in the weak programming, the voltage lower than the voltage applied in the programming is applied to at least one of the control gate and the drain of the field-effect transistor of said each memory cell to rise the threshold value of said each memory cell by a smaller level than in the programming.

* * * * *